(12) United States Patent
Rogers et al.

(10) Patent No.: US 7,300,082 B2
(45) Date of Patent: Nov. 27, 2007

(54) ACTIVE EDGE GRIPPING AND EFFECTOR

(75) Inventors: Theodore W. Rogers, Point Richmond, CA (US); Shawn M. Hamilton, Boulder Creek, CA (US); Michael J. Mayo, Palo Alto, CA (US)

(73) Assignee: Asyst Technologies, Inc., Fremont, CA (US)

( * ) Notice: Subject to any disclaimer, the term of this patent is extended or adjusted under 35 U.S.C. 154(b) by 151 days.

(21) Appl. No.: 10/624,133

(22) Filed: Jul. 21, 2003

(65) Prior Publication Data

US 2005/0017529 A1 Jan. 27, 2005

(51) Int. Cl.
*B25J 15/08* (2006.01)
*B25J 13/08* (2006.01)

(52) U.S. Cl. .................. 294/104; 294/907; 414/941; 901/34; 901/46

(58) Field of Classification Search ............ 294/103.1, 294/104, 115, 116, 907; 901/32–35, 46, 901/47; 414/941
See application file for complete search history.

(56) References Cited

U.S. PATENT DOCUMENTS

| | | | |
|---|---|---|---|
| 4,579,380 A * | 4/1986 | Zaremsky et al. | 294/119.1 |
| 4,680,523 A * | 7/1987 | Goumas et al. | 318/685 |
| 4,715,637 A * | 12/1987 | Hosoda et al. | 294/86.4 |
| 5,022,695 A * | 6/1991 | Ayers | 294/88 |
| 5,702,228 A | 12/1997 | Tamai et al. | |
| 5,788,453 A * | 8/1998 | Donde et al. | 414/744.5 |
| 5,988,971 A * | 11/1999 | Fossey et al. | 414/416.01 |
| 6,116,848 A * | 9/2000 | Thomas et al. | 414/754 |
| 6,155,773 A | 12/2000 | Ebbing et al. | |
| 6,256,555 B1 * | 7/2001 | Bacchi et al. | 700/245 |
| 6,322,312 B1 | 11/2001 | Sundar | |
| 6,467,827 B1 | 10/2002 | Ardezzone | |
| 6,491,330 B1 | 12/2002 | Mankame et al. | |
| 6,623,235 B2 * | 9/2003 | Yokota et al. | 414/744.8 |
| 6,682,113 B2 * | 1/2004 | Cox et al. | 294/104 |
| 2003/0085368 A1 | 5/2003 | Kesil et al. | |
| 2003/0130759 A1 | 7/2003 | Kesil et al. | |

* cited by examiner

*Primary Examiner*—Dean J Kramer
(74) *Attorney, Agent, or Firm*—Martine Penilla & Gencarella, LLP

(57) ABSTRACT

The present invention generally relates to an end effector that utilizes a gripping mechanism to grip a peripheral edge of the wafer and secure the wafer to the end effector. In one embodiment, the gripping mechanism includes a pair of gripper arms that pivot between a wafer-loading position and a wafer-engaging position. In another embodiment, an active plunger moves linearly between the wafer-loading and wafer-engaging positions. Both the gripper arms and the plunger device are driven by a motor assembly. A force feedback system monitors the force the gripping mechanism exerts on the wafer and, based on the amount of force, controls the operation of the motor assembly to dynamically adjust the position of the gripping mechanism.

17 Claims, 12 Drawing Sheets

ACTIVE EDGE GRIPPING AND EFFECTOR

FIELD OF THE INVENTION

The present invention generally relates to an end effector for acquiring and transporting semiconductor wafers. More particularly, the present invention comprises an end effector that includes a mechanical actuator having the ability to vary the gripping force exerted by a gripping mechanism on a wafer.

BACKGROUND OF THE INVENTION

Various types of wafer-handling robots are known for transporting the wafers to and from the FOUP and among processing stations. Many such robots employ a robotic arm having a spatula-shaped end that is inserted into the cassette to remove or insert a wafer. The spatula-shaped end of the robotic arm is commonly referred to as an end effector. One type of end effector secures the wafer contact surface to the wafer by a vacuum source. The vacuum source pulls the bottom surface of the wafer into contact with the entire wafer contact surface.

With many workpieces, and certainly with semiconductor wafers, the surfaces of the workpieces can be easily damaged if the wafer-handling robot contacts the top or bottom surface of the wafer. Because of this, the wafer-handling robot should preferably contact only the peripheral edge of the wafer, or at most, the bottom surface within a narrow distance from the edge (known within the semiconductor industry as the "edge exclusion zone"). A wafer-handling robot must load wafers into and unload wafers from a wafer processing apparatus with a high degree of precision to avoid contacting the critical surfaces of the wafer.

FIG. 1 illustrates a conventional wafer-handling end effector. The wafer-handling robot 10 supports a wafer 12 by a wafer blade 11 that has a proximal end 12 and a distal end 14. The distal end 14, in this configuration, has two spaced apart and substantially parallel fingers—a first finger 16 and a second finger 18. The first finger 16 includes a distal wafer support 20 that contacts the wafer 12 either along the peripheral edge or the Exclusion Zone. The second finger 18 also includes a distal wafer support 22 that contacts the wafer in a similar manner.

The wafer blade 11 also includes proximal wafer supports 24 and 26. The proximal wafer supports 24 and 26 also contact the wafer 12 either along the peripheral edge of the wafer 12 or along the Exclusion Zone. The distal wafer supports 20 and 22 include a backstop portion to prevent the wafer 12 from sliding off the wafer blade 11 during transport. A wafer 12 is not always perfectly positioned on the wafer blade 11 such that the peripheral edge of the wafer rests against the wafer supports 20 and 22 at all times. Sudden movement or high rotational speeds by the wafer handling robot 10 may throw the wafer 12 against the supports 20 and 22 and cause damage to the wafer 12, or cause the wafer 12 to slip over the wafer supports 20 and 22 and off the blade 11. An example of an end effector similar to that shown in FIG. 1 is disclosed in U.S. Pat. No. 6,077,026, issued to Schultz, entitled "Programmable Substrate Support For a Substrate Positioning System," which is assigned to Asyst Technologies, Inc., and is incorporated herein by reference.

As the robot speed and acceleration increase, the amount of time spent handling each wafer and delivering each wafer to its next destination is decreased. The desire for speed, however, must be balanced against the possibility of damaging the wafer or the film formed on the wafer. If a robot moves a wafer too abruptly, or rotates the wafer blade too fast, the wafer may slide off the blade, potentially damaging the wafer. Further, particle contaminants may result if the wafer slides around on the end effector. In addition, movement of the wafer on the wafer blade may cause substantial misalignment of the wafer. A wafer that is not aligned may result in inaccurate processing or even additional particle generation.

Wafer handling robots that grip the wafer by its peripheral edge exist today. By way of example only, one type of robot end effector includes an active contact point that moves between a retracted wafer-loading position and an extended wafer-engaging position that urges the wafer against a pair of distal wafer supports. Another example of a robot end effector includes a pair of arms that grip the peripheral edge of the wafer after the wafer is placed on the blade. The active contact point and the pair of arms retract and extend through a vacuum or pneumatically actuated mechanism. Vacuum and pneumatic actuation mechanisms provide poor control of the maximum force exerted on the wafer, because velocity of the active contact point or the arms cannot be controlled.

After the end effector lifts a wafer off a cassette support, the active contact point (or the pair of arms) extends to contact the peripheral edge of the wafer and push the wafer against the distal wafer supports. The active contact point holds the wafer in place on the wafer blade. A vacuum actuated gripping device, for example, cannot stop or vary its speed between the retracted wafer-loading position and the extended wafer-engaging position.

An end effector that incrementally controls the motion of the gripping device, which prevents damage to the wafer, is a desirable feature. An end effector having a real-time force feedback system that monitors the force exerted on the wafer is also a highly desirable feature.

SUMMARY OF THE INVENTION

One aspect of the present invention is to provide an end effector that creates four points of contact along the peripheral edge of the wafer to improve the centering ability of the end effector. In one embodiment, the gripping mechanism includes two gripping arms and, in combination with two static rest pads, secures the wafer to the end effector. The gripping arms and static rest pads provide four contact points along the peripheral edge of the wafer. In another embodiment, the gripping mechanism includes a plunger having a pair of spaced apart contact pads. The plunger, similar to the gripping arms, provides two contact points along the peripheral edge of the wafer.

Another aspect of the present invention is to provide an end effector that reduces or eliminates particles created by securing the wafer to the end effector. In one embodiment, the end effector includes a centering device adapted to center the wafer on the end effector before the end effector picks up the wafer. After the wafer is seated on the end effector, a gripping mechanism secures the wafer on the end effector. If the wafer is pre-centered, the wafer will not slide substantially on the end effector, if at all, when the wafer is secured to the end effector by the gripping mechanism. In another embodiment, the contact pads of the gripping mechanism initially contact the peripheral edge of the wafer in such a manner as to minimize any sliding of the wafer.

Yet another aspect of the present invention is to provide an end effector that provides precise motion control of the contact pads. The gripping mechanism includes a motor assembly that drives a carriage, which is operatively coupled to the gripping arms. In one embodiment, a cam engages the carriage such that the cam's rotational motion drives the translational member along a linear path. The linear motion of the carriage in turn imparts rotational motion to the gripper arms.

Still yet another aspect of the present invention is to provide an end effector that includes a real-time force feedback system. The force feedback system minimizes the initial impact force exerted by the gripping mechanism against the wafer. The force feedback system also maintains the force exerted by the gripping mechanism against the wafer at a constant state. In one embodiment, each contact pad includes a force sensing device to detect the amount of force the contact pad is exerting on the wafer. The force sensing device is electrically coupled to the motor assembly to create a closed loop feedback system. In another embodiment, the force feedback system is an open loop system.

Another aspect of the present invention is to provide an end effector that has optical means for sensing the presence of a wafer. In one embodiment, thru-beam sensors detect a wafer proximate to the digital end of the end effector.

Yet another aspect of the present invention is to provide an end effector that may approach the wafer from above and pick up the wafer. The gripping surfaces of the wafer are vertical (e.g., the peripheral edge of wafer). The force feedback system ensures that the force exerted by the gripping mechanism on the wafer is sufficient to prevent the wafer from falling off the end effector.

Still another aspect of the present invention is to provide an end effector that minimizes the initial impact the gripping mechanism places on the wafer. Controlling the speed of the gripping mechanism as it approaches the wafer reduces the large impact force exerted against the wafer that a conventional edge grip device produces (e.g., vacuum actuated plunger). The speed of the gripping mechanism may be controlled—whether the gripping mechanism is a pair of gripper arms or a plunger.

Yet another aspect of the present invention is to provide an end effector that recognizes when the gripping mechanism attempts to grip a wafer that is not present on the wafer blade. In one embodiment, an "over-travel" position is identified when the gripping mechanism moves to a location that should contact a wafer and yet no contact is made.

DETAILED DESCRIPTION OF THE INVENTION

An end effector 100 manufactured according to one or more embodiments of the present invention will now be described with reference to FIGS. 2-13. In general, the end effector 100 includes a gripping mechanism that contacts the peripheral edge of a wafer in order to secure the wafer to the end effector 100.

Figure 1:
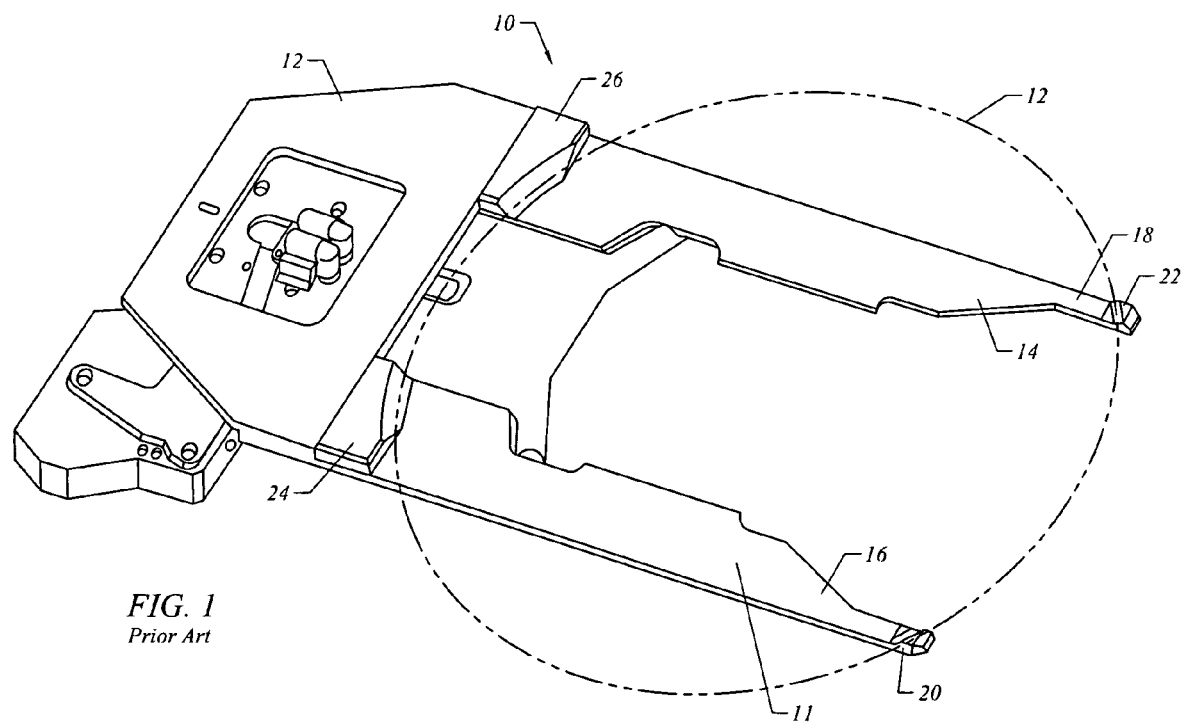
FIG. 1 is a top perspective view of a conventional end effector, according to the prior art.
Figure 2:
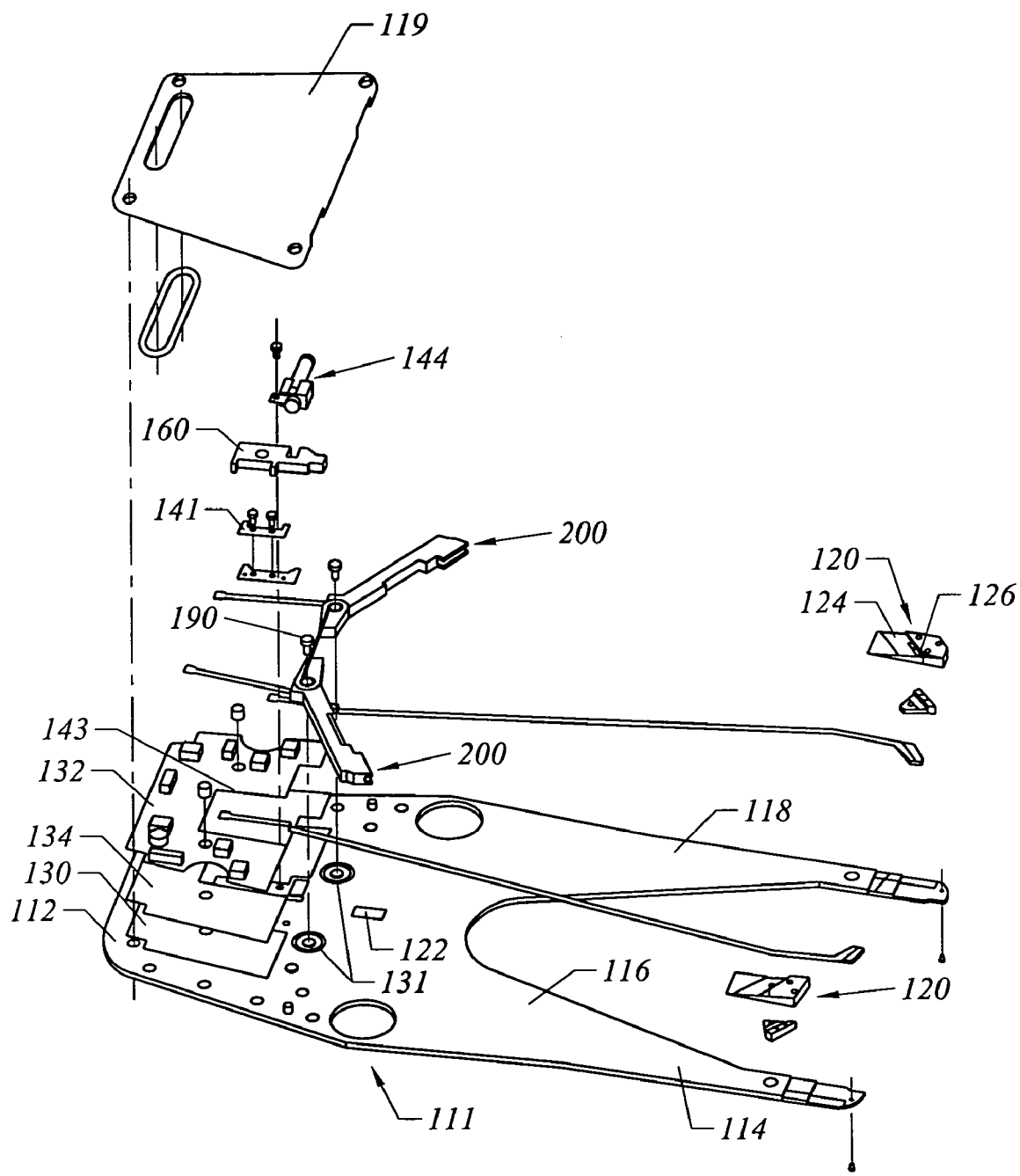
FIG. 2 is an assembly view of an embodiment of an active grip end effector, according to the present invention.
Figure 3:
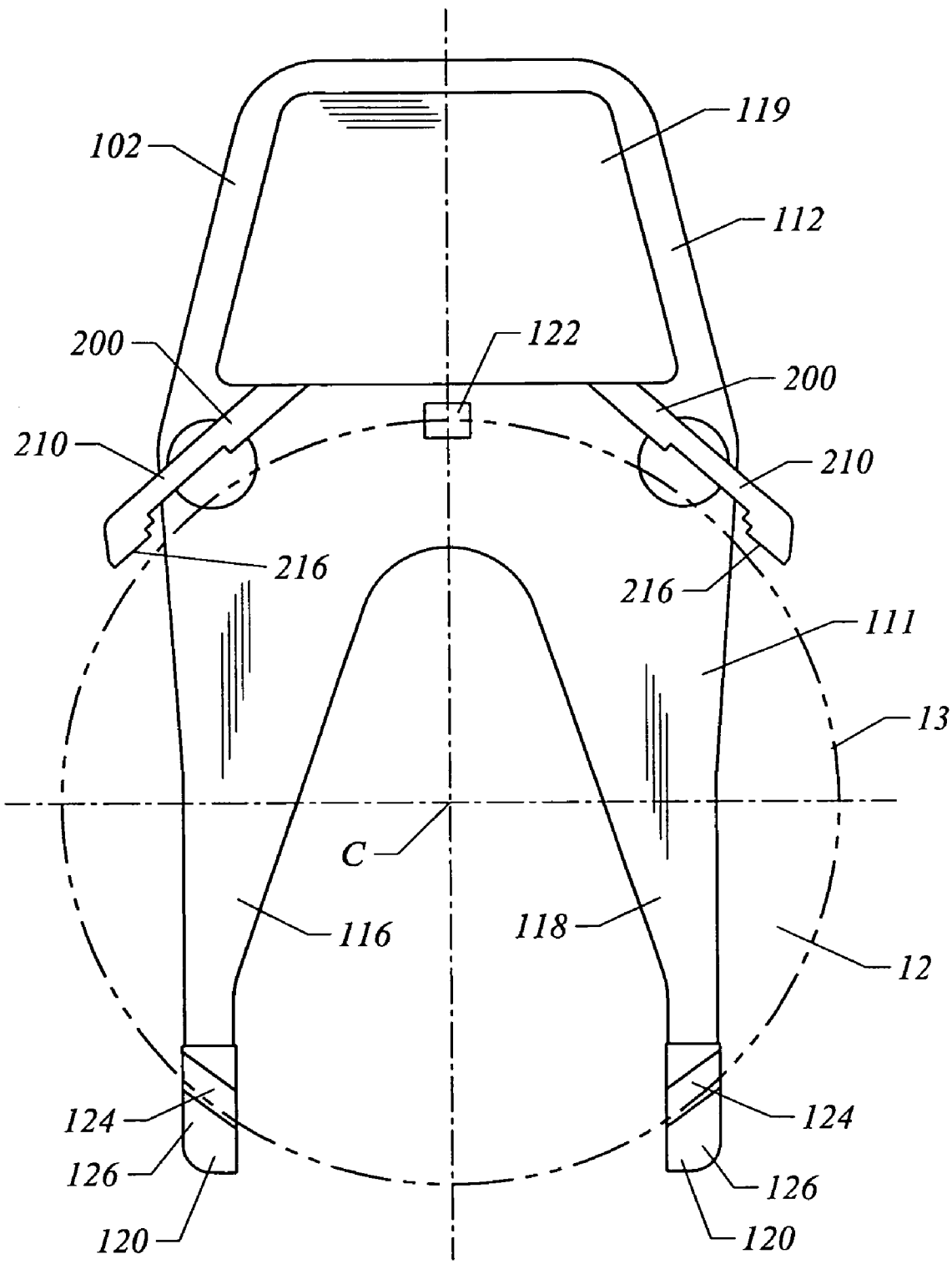
FIG. 3 is a top view of an embodiment of the end effector shown in FIG. 2, illustrating the gripper arms in a wafer-loading position.
Figure 4:
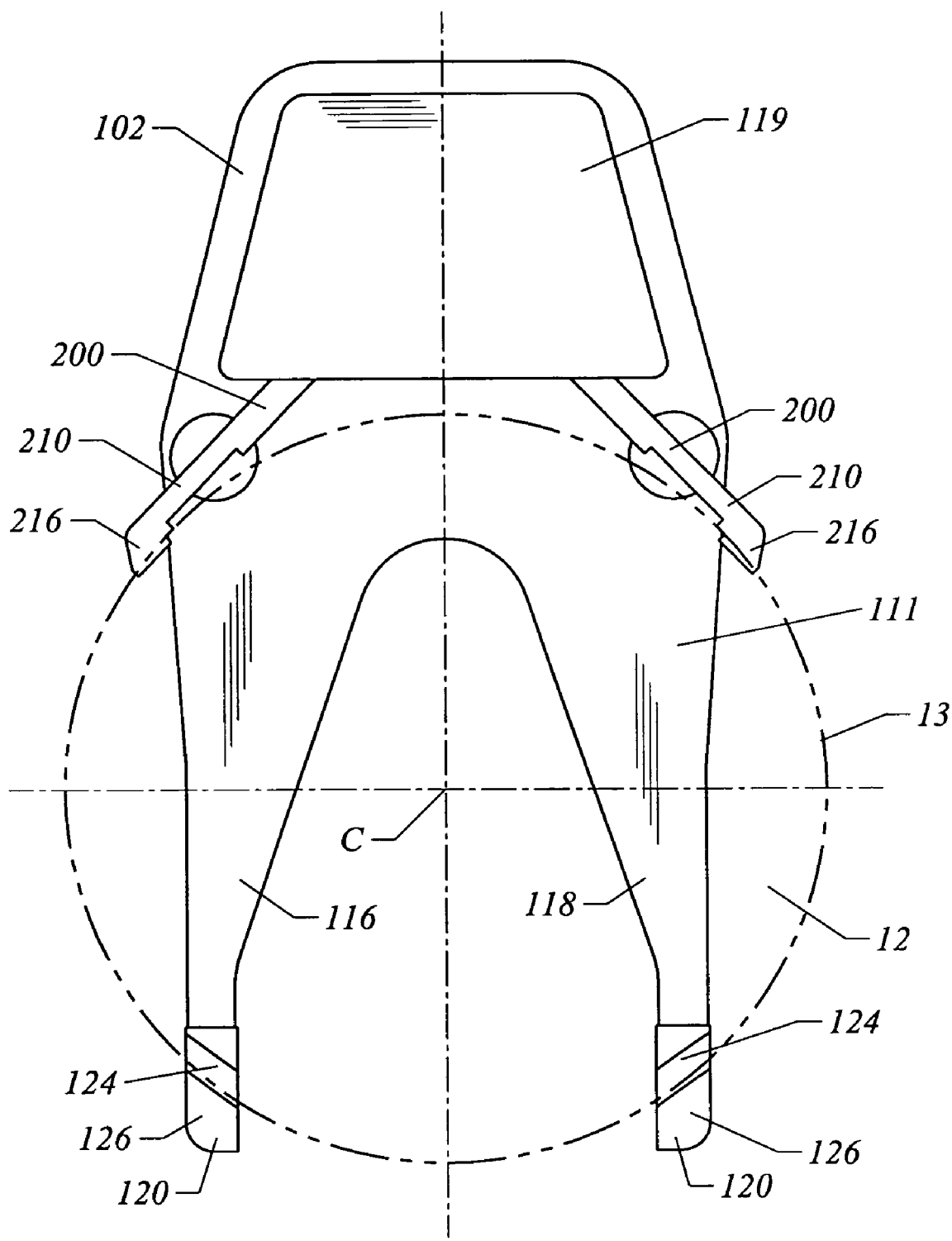
FIG. 4 is a top view of an embodiment of the end effector shown in FIG. 2, illustrating the gripper arms in a wafer-engaging position.

FIGS. 2-4 illustrate one embodiment the end effector 100. In this embodiment, the end effector 100 has a proximal end 112 and a distal end 114. The distal end 114 of the end effector 102 comprises a wafer blade 111 having two spaced apart fingers 116 and 118. The distal end of the two fingers 116 and 118 each include a wafer support pad 120 for supporting a portion of a wafer 12 seated on the wafer blade. It is within the scope and spirit of the invention for the wafer blade 111 to comprise a single finger in order to provide a narrower end effector. The wafer blade 111 also includes a proximal wafer support 122 so that a wafer seated on the wafer blade 111 is supported in three areas. As shown in FIG. 3-4, the wafer supports 120 and 122 are spaced apart such that the wafer's geometrical center C is located between the supports.

The distal wafer supports 120 include a platform 124 and a backstop 126. The platform 124 may have several configurations. If the platform 124 is, for example, a substantially flat or horizontal surface, the wafer platform 124 will contact the wafer 12 along the exclusion zone when the wafer 12 is seated on the wafer blade 111. If the platform 124 is a slanted or sloped surface (e.g., a raked surface), the platform 124 will only contact the peripheral edge of the wafer while it is seated on the wafer blade 111. The backstop 126 extends upward from the platform 124. The backstop 126 contacts the peripheral edge of the wafer 12 and prevents the wafer 12 from sliding off the wafer blade 111. It is within the scope and spirit of the invention for the backstop 126 to comprise other shapes such as, but not limited to, an arcuate shape that conforms to the peripheral edge of the wafer 12 and/or a sloped surface.

The end effector 100 picks up a wafer 12 by sliding the wafer blade 111 beneath the wafer 12 until the backstop 126 is located just past the edge of the wafer 112. The wafer blade 111 is then raised until the platform 124 contacts the wafer 12. The end effector 100 raises the wafer 12 off a wafer support and the gripper mechanism (described later) secures the wafer 12 to the end effector 100. Releasing the wafer 12 is accomplished by reversing the steps performed to pick up the wafer 12. The gripping mechanism releases the wafer 12, lowers the wafer 12 onto a support surface and withdraws from the proximity of the wafer 12.

It may be useful on occasion to approach the wafer 12 from its top surface to pick up the wafer 12. In this embodiment, the wafer 12 is supported substantially by the gripping mechanism. An end effector that approaches a wafer from the top to grip it preferably includes a center finding mechanism (described later) that locates the center of the wafer prior to gripping the wafer. The wafer will otherwise slide on the wafer supports when the gripping mechanism contacts the peripheral edge of the wafer—potentially damaging the wafer. An example of a system for positioning an end effector of a wafer handling robot with respect to a wafer is described in U.S. Pat. No. 6,298,280, entitled "Method for In-Cassette Wafer Center Determination," issued to Bonora, et al., which is assigned to the owner of this invention and is incorporated in its entirety herein.

The proximal end 112 of the wafer blade 111 also includes a mounting area 130. The mounting area 130 is adapted to receive a printed circuit board ("PCB") 132, that in one embodiment, includes the controllers for the gripping mechanism. An insulating plate 134 is preferably located between the PCB 132 and the wafer blade 111 to electrically isolate the components on the PCB 132 from the blade 111.

Some of the key components of the gripping mechanism, which will be described in more detail later, include a motor assembly 144, a carriage 160, a flexible link 190, and a pair of gripper arms 200. In the embodiment shown in FIGS. 3-4, the gripping mechanism comprises a pair of gripping arms 200. FIG. 3 shows the gripping arms 200 located in a wafer-loading position. In this position, the contact pads 216 of each gripper arm 200 are retracted away from the peripheral edge 13 of the wafer 12 and the end effector 100 may pick up or drop off a wafer 12. FIG. 4 shows the gripper arms 200 located in a wafer-engaging position. In this position, the contact pads 216 of each gripper arm 200 contacts the peripheral edge 13 of the wafer 12 and exerts a force on the wafer 12. The gripper arms 200 may be moved to any position between the wafer-loading and the wafer-engaging positions.

Figure 5C:
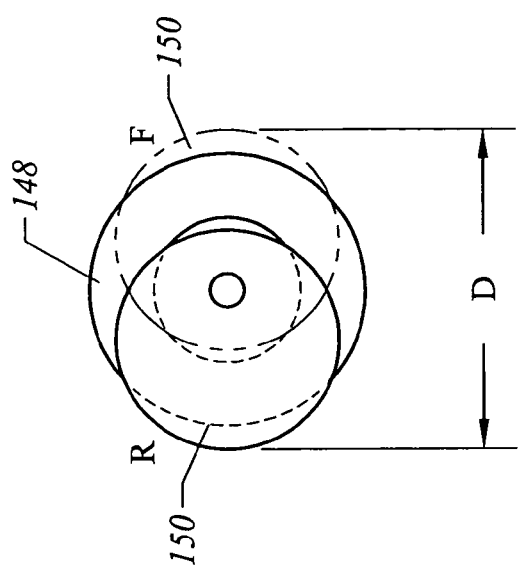
FIGS. 5A-5C illustrate one embodiment of a motor assembly, according to the present invention.
Figure 5B:
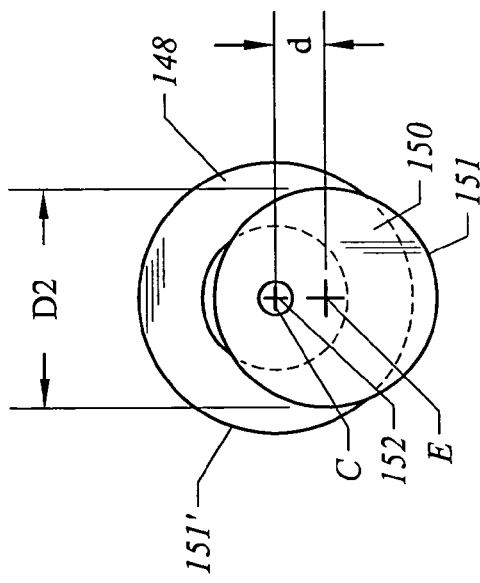
Figure 5A:
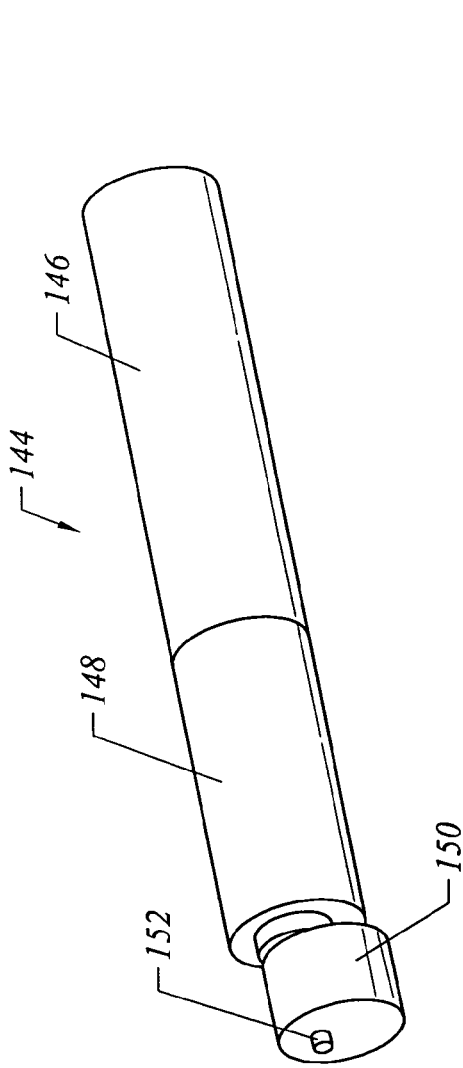

FIG. 5A-5C illustrate one embodiment of the motor assembly 144. The motor assembly 144, in this embodiment, includes a motor 146, a planetary gearhead 148, and a cam 150. The motor 146 is, for example, a 6 mm diameter 1.2-watt brushless D.C. motor that operates between 3,000-4,000 rpm. The motor assembly 144 therefore has a very low profile. A small motor diameter is preferred to provide a low profile end effector. It is within the scope and spirit of the invention for the motor 146 to have a different power rating and/or diameter. Other mechanical devices, such as a leadscrew, may be coupled to the motor 146 instead of the planetary gearhead 148.

A planetary gearhead 148 is mechanically coupled to the motor 146 to greatly reduce the speed of the output shaft 152 and provide a greater control over the motion of the cam 150. The planetary gearhead is preferably coaxially aligned with the motor 146. A planetary gearhead is well-known in the mechanical areas and does not require further disclosure. In one embodiment, the planetary gearhead 148 provides a 57:1 gear reduction between the speed of the motor shaft and the spread of the output shaft 152. The planetary gearhead 148, however, may provide other gear reduction ratios. The output shaft 152 of the planetary gearhead 148, in this example, rotates fifty-seven times slower than the speed of the motor 146. The high ratio planetary gearhead 148 allows the motor 146 to precisely control the rotation of the output shaft 152. For example, the motor must rotate fifty-seven times to impart one revolution of the output shaft 152. The motor 146 can therefore move each gripper arm 200 a distance equivalent to $\frac{1}{57}$ of a rotation of the output shaft 152.

Other embodiments of the motor assembly 144 may not include a planetary gearhead. A motor assembly 144 may use, for example, a motor and a leadscrew to drive the cam 150. Each embodiment of the motor assembly 144 preferably tracks the motion of the motor by hall-effect sensors. Hall-effect sensors are well-known within the art and do not require further disclosure. The location of each gripper arm 200 may be determined by the hall state of the motor 146. In one embodiment, each Hall state corresponds to 6 microns of movement of the gripping arms 200.

The cam 150 is coupled to the output shaft 152. FIG. 5B illustrates that the geometrical center E of the cam 150 is offset a distance d from the rotational center G of the output shaft 152. The offset d allows the outer edge 151 of the cam 150 to extend beyond the outside perimeter 151 of the planetary gearhead 148. The rotation of cam 150 imparts linear motion to the carriage 162. In this embodiment, the carriage 160 may move a total distance equivalent to twice the offset d. The carriage 160, in general, requires a certain range of travel to allow the gripper arms 200 to pick up off center wafers The gripper arms 200, however, need to do that with a certain amount of force to secure the wafer 12 on the wafer blade 111.

FIG. 5C illustrates that the cam 150 may rotate through a 180° range of motion. The furthest position to the left (as viewed in FIG. 5C) is referred to as the rear position and is shown as position R. The furthest position to the right (as viewed in FIG. 5C) is referred to as the forward position and is shown as position F. The total linear travel distance of the cam 150 between the rear position R and the forward position F is shown as distance D. The cam 150 may be rotated to any position located between the rear position R and the forward position F.

Figure 6:
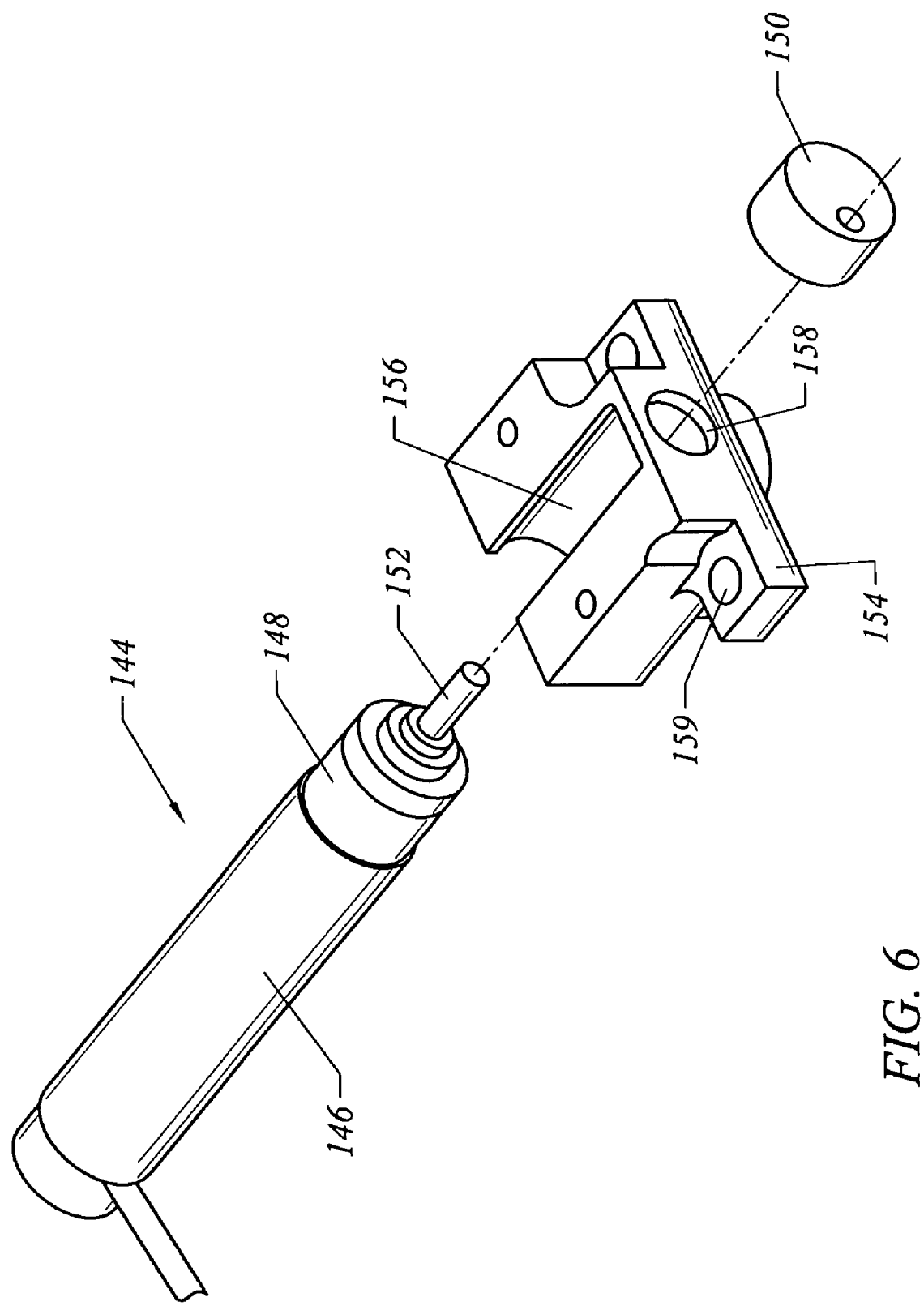
FIG. 6 is an assembly view of the motor assembly shown in FIG. 5 in conjunction with a motor mounting block.

FIG. 6 illustrates one embodiment of a mounting block 154 that secures or fastens the motor assembly 144 to the wafer blade 111. In this embodiment, the mounting block 154 has a channel 156 and a bore 158 to accommodate the motor assembly 144. The channel 156 is adapted to receive the motor 146 and the planetary gear 148. The motor 146 and the planetary gearhead 148 are preferably secured to the channel 156 to prevent to motor 146 and the planetary gearhead 148 from rotating within the channel 156. The bore 158 is located at one end of the channel 156 so that the output shaft 152 extends through the bore 158. The mounting block 154 includes two alignment holes 159 that dowel pins, as an example, pass through to align the mounting block 154 on the wafer blade 111 (See FIG. 2). It is within the scope and spirit of the invention to mount the motor assembly 144 to the wafer blade 111 in another manner.

Figure 7A:
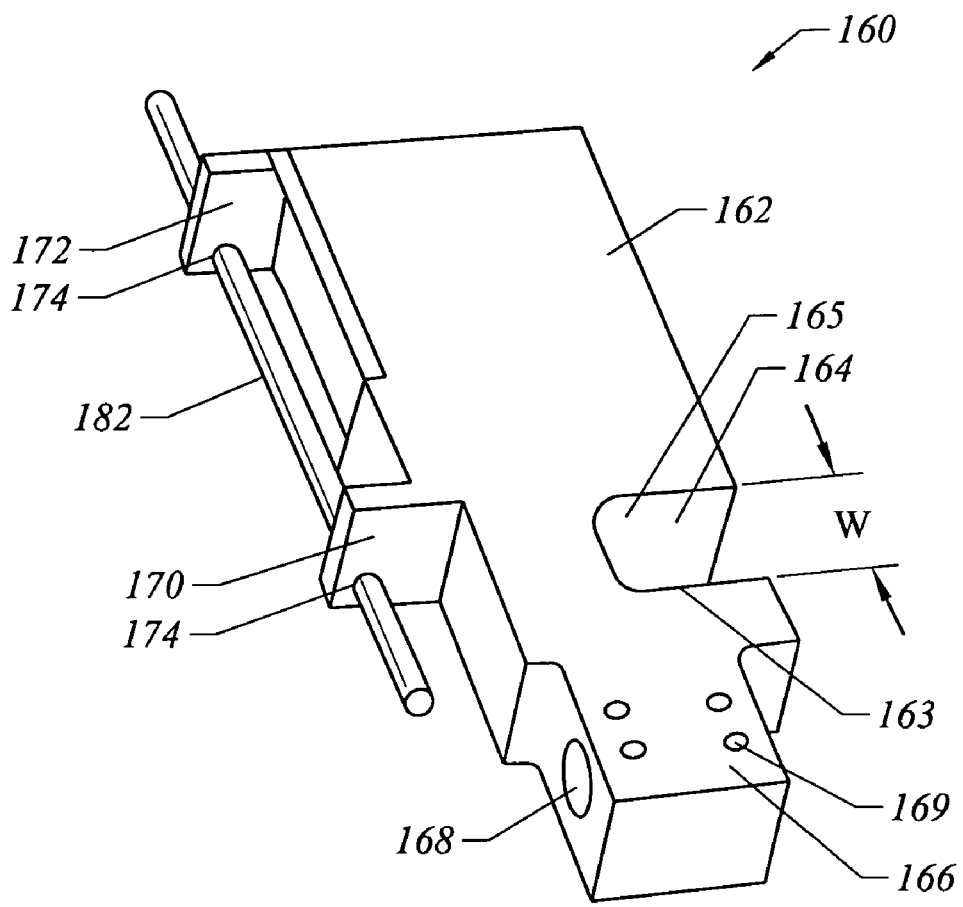
FIGS. 7A-7B illustrate one embodiment of a carriage, according to the present invention.
Figure 7B:
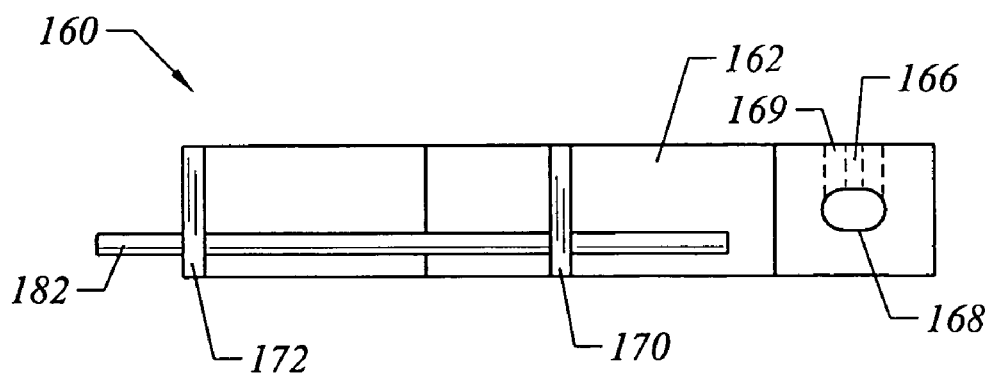

The cam 150 is operatively coupled with a carriage 160 (see FIGS. 7A-7B). The rotational motion of the cam 150 drives the carriage 160 along a substantially linear path. In one embodiment, the cam 150 is seated within a drive slot 164 of the carriage 160. As the cam 150 rotates, the outer edge 151 of the cam 150 drives the carriage 160 either towards or away from the wafer blade 111. The width W of the drive slot 164 and the diameter D2 of the cam 150 are preferably substantially equal so that the outer edge of the cam 150 is in contact with the drive slot 164 at all times.

When the cam 150 rotates, for example, counterclockwise (as viewed in FIG. 5C), it contacts a forward face 163 of the slot 164 and pushes the body 162 of the carriage 160 forward (toward the wafer). The cam 150 continues to drive the body 162 forward until the cam 150 rotates into position F (see FIG. 5C). Similarly, the cam 150 drives the body 162 rearward by rotating the cam 150 clockwise (as viewed in FIG. 5C) towards the rear position R. Since the cam 150 and carriage 160 are in slidable contact with each other, they are preferably manufactured from a low resistance, low wear material to prevent particle generation proximate to the wafer 12.

FIGS. 7A-7B illustrate one embodiment of the carriage 160 which provides a link between the motor assembly 144 and the gripper arms 200. One side of the carriage body 162 includes a first guide 170 and a second guide 172 that extend outward from the body 162. The guides 170 and 172 are preferably spaced apart and substantially parallel to each other. Each guide includes a bore 174. The bore hole 174 may extend through any portion of the support guides 170 and 172 as long as the geometric center of each bore hole 174 is concentrically aligned with the other.

As previously discussed above, the carriage 160 travels along a linear path. The bore holes 174 are adapted to receive a guide rail 182. The carriage 160 slides along the guide rail 182, which also prevents lateral motion of the carriage 160.

It is within the scope and spirit of the invention to restrict the motion of the carriage 160 by devices other than a guide rail 182. Regardless, the carriage 160 slides along the proximal end of the end effector. In one embodiment, the end effector 100 includes a slot 143 that the carriage 160 slides within. The slot 143 allows the carriage 160 to travel freely back and forth, yet constrains the lateral motion of carriage 160. In another embodiment, the carriage 160 includes multiple support surfaces (not shown) that extend from the bottom of the carriage 160. Only the support members contact the wafer blade 111, thus provide a smaller contact surface area between the wafer blade 111 and the carriage 160.

The carriage 160 is coupled with the cam 150. One side of the carriage 160 includes a drive slot 164 that the cam 150 sits within. The drive slot 164 extends, in this embodiment, vetically through the body 162 to form a front surface 163 and a rear surface 165. The drive slot 164, as shown in FIG. 7A, has a width w that is substantially equal to the diameter d2 of the cam 150 (see FIG. 5C).

The front portion 166 of the carriage 160 is operatively connected to the flexible link 190. The front portion 166, in order to accommodate the flexible link 190, has a bore 168 extending horizontally through it. In one embodiment, four vertical dowel holes 169 extend from the top surface of the body 162 to the horizontal bore 168. Dowel pins (not shown), or other fastening devices, may be inserted into the holes 169 to prevent the flexible link 190 from moving laterally (towards or away from the wafer) within the carriage 160.

The motor assembly 144, through the cam 150, drives the carriage 160. Any motion by the cam 150 preferably imparts motion to the carriage 160. The end of cam travel (e.g., cam 150 is located at 0° or 180° degrees), however, may allow a couple degrees of cam motion to translate into no linear motion of the carriage 160. The cam 150, in other words, is not doing useful work during some portion. If the cam 150 is allowed to rotate completely to the 0° or 180° position (defined as an "overtravel"position), the cam 150 further may jam or the end effector 100 will lose track of the precise location of the carriage 160.

A hard stop device 141 (See FIG. 2) prevents the cam 150 from reaching the overtravel position. The hard stop 141 is positioned such that the guides 170 will contact the hard stop 141 before the cam reaches the forward position F or the rear position R. In another embodiment, the carriage 160 includes a bore in the top surface that a dowel pin, or other similar device, fits into. The top portion of the dowel pin travels within a track located above the carriage 160 as the carriage 160 moves between its first and second positions. The track prevents the dowel pin from traveling beyond a certain distance in both the forward and backward directions and will thus stop the travel of the carriage 160 too. When either the guide 170, or the dowel pin, contacts the hard stop 141 when traveling in the backward direction (away from the wafer), the gripper arms 200 are located at a "home" position.

Figure 8B:
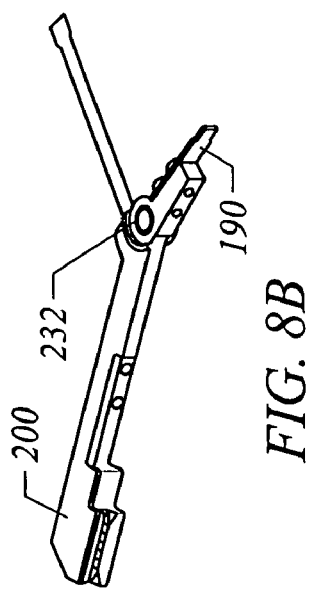
FIGS. 8A-8B illustrate an embodiment of a gripper arm, according to the present invention.
Figure 8A:
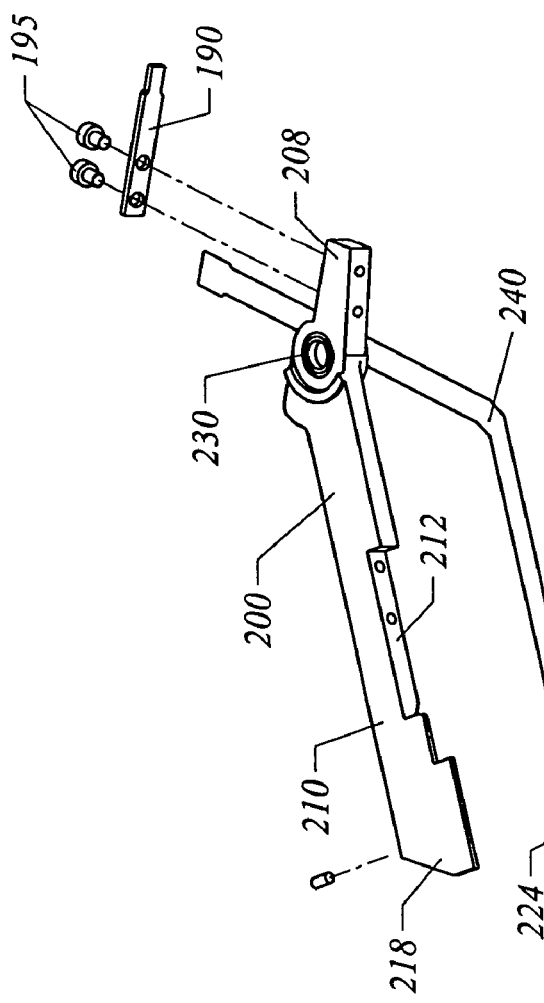

FIG. 8A-8B illustrate one embodiment of a gripping mechanism—a pair of gripping arms 200 (see also FIGS. 2-4). Each gripper arm 200 preferably comprises a unitary construction and includes a driver portion 208 and a cantilever portion 210. The driver portion 208 is connected to the flexible link 190. As shown in FIG. 8A, the driver portion 208 is fastened to the flexible link 190 by a pair of screws or dowel pins 195. It is within the scope and spirit of the invention to secure the flexible link 190 to the driver portion 208 by other methods such as, but not limited to, a bolt, a screw, welding and the like. The cantilever portion 210 includes a contact pad 216, a sensor 214, and a force sensing device 228. The sensor 214 preferably includes a pair of transmitters 224 and a pair of receivers 226. Two optical paths are preferred, because a single optical path may be located over the wafer's indicial notch when the wafer 12 is placed on the wafer blade 111, and thus not recognize that a wafer is located on the end effector 100.

A contact pad 216 is secured to the sensor 214 and is the only portion of the gripper arm 200 that contacts the wafer 12. In this embodiment, the contact pad 216 includes a mounting segment 217 that fastens to the cantilever portion 210 of a gripper arm 200. It is within the scope and spirit of the invention to integrate the sensor 214 and/or the contact pad 216 into the distal end 218 of the gripper arm 200. In one embodiment, the contact pads 216 comprise an upper pad 220 and a lower pad 222 to form a "C"-shape contact pad where the wafer 12 sits between the upper and lower pads.

The force sensing device 228 is located behind the contact pad 216. A small gap exists between the arm and the back surface of the contact pad. In operation, the gripper arms 200 grip the peripheral edge 13 of the wafer 12 until the gripper arms 200 are pushes back into the load cell. A load cell converts displacement of the contact pad 216 into a measurable voltage difference. An electrical signal that represents the voltage difference is sent to and processed by a microprocessor that controls the operation of the motor assembly 144. Alternatively, the load sensing device 228 may comprise a strain gauge. A strain gauge is well known within the art and does not require further disclosure. It is within the scope and spirit of the invention to integrate the load sensing device 228 or strain gauge into a gripper arm 200 or contact pad 216.

Figure 9:
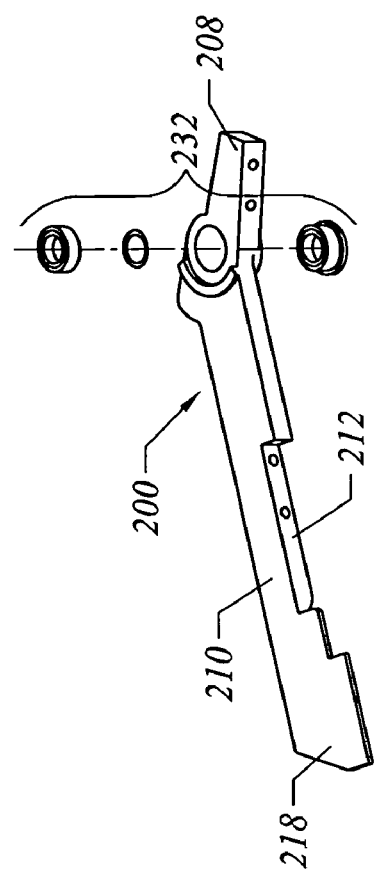
FIG. 9 is an assembly view of the gripper arm shown in FIGS. 8A-8B, illustrating a bearing assembly.

Movement by the carriage 160 displaces the flexible link 190. FIG. 9 illustrates that, in one embodiment, each gripper arm 200 contains a ball bearing assembly 230 that is secured to, and rotates about, a post 232. A ball bearing assembly 230 is well-known within the art and does not require further disclosure. Each gripper arm 200 may also rotate by other means.

The flexible link 190, in general, functions as a leaf spring. When the carriage 160 travels away from the wafer 12, for example, the carriage 160 pulls the center 191 of the flexible link 190 away from the wafer 12 and rotates the gripper arms 200 into the wafer-engaging position (FIG. 4). The flexible link 190 compensates for any amount of wafer offset so that, for example, both gripper arms 200 engage the wafer 12 even if the wafer is not centered on the wafer blade 111. The flexible link 190 also prevents overloading of the drive mechanism 144 if an operator manually inserts a wafer of the wafer blade 111.

The gripper arms 200 may contact the peripheral edge of the wafer 12 at substantially the same, or at a different, time. FIG. 2-4 illustrate that the carriage 160 is located substantially equally between the gripper arms 200. The carriage 160 may also be located in other positions relative to the gripper arms 200. By way of example only, the carriage 160 may be located closer to one gripper arm than the other.

The default or home position of the gripper arms 200 is the wafer-loading position (see FIG. 3). In the wafer-loading position, the gripper arm 200 are retracted, providing space so that end effector 102 may pick-up a wafer 12.

Figure 10:
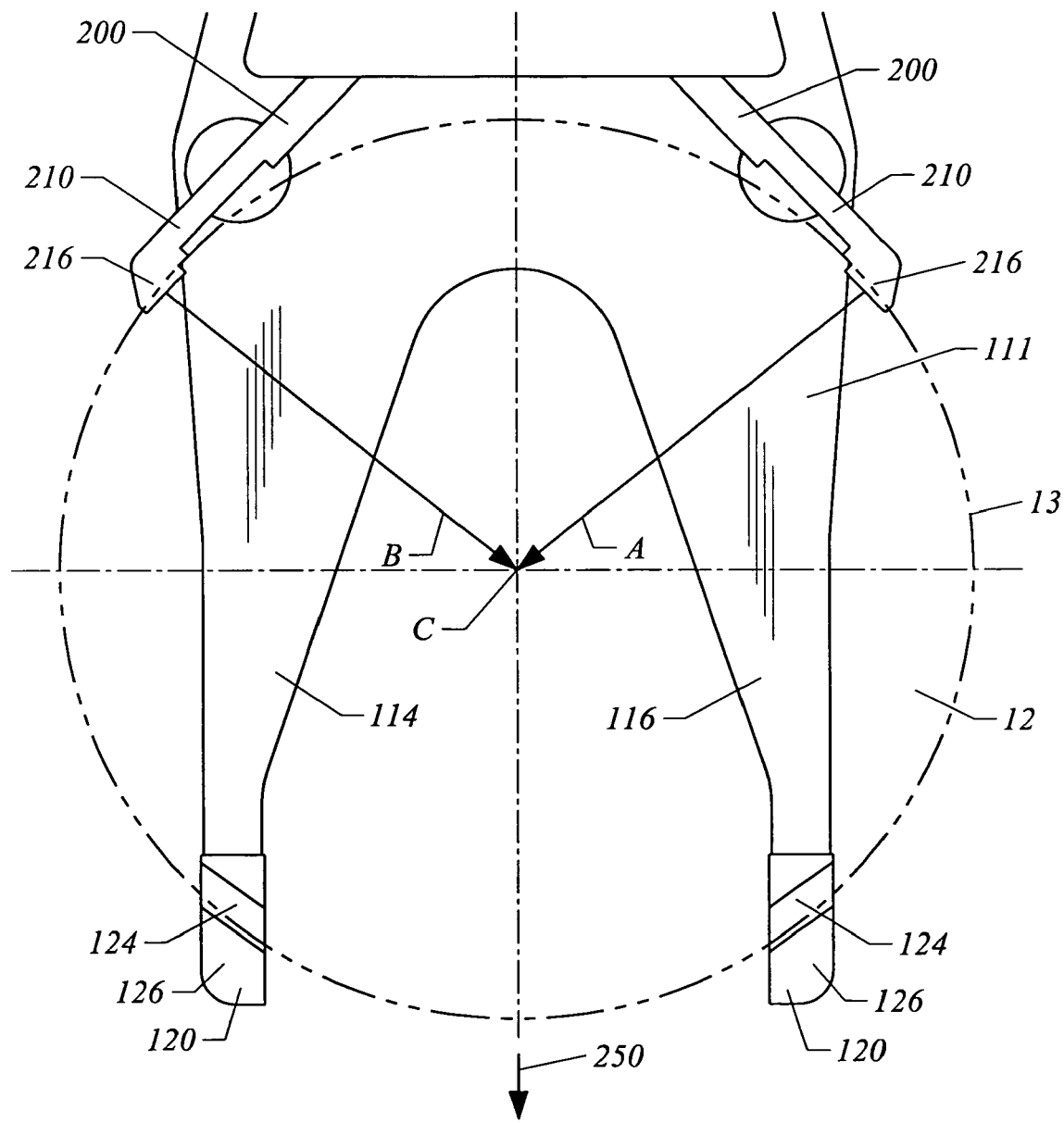
FIG. 10 is a top view of the end effector shown in FIG. 2, illustrating the contact point of the gripper arms against the wafer.
Figure 11:
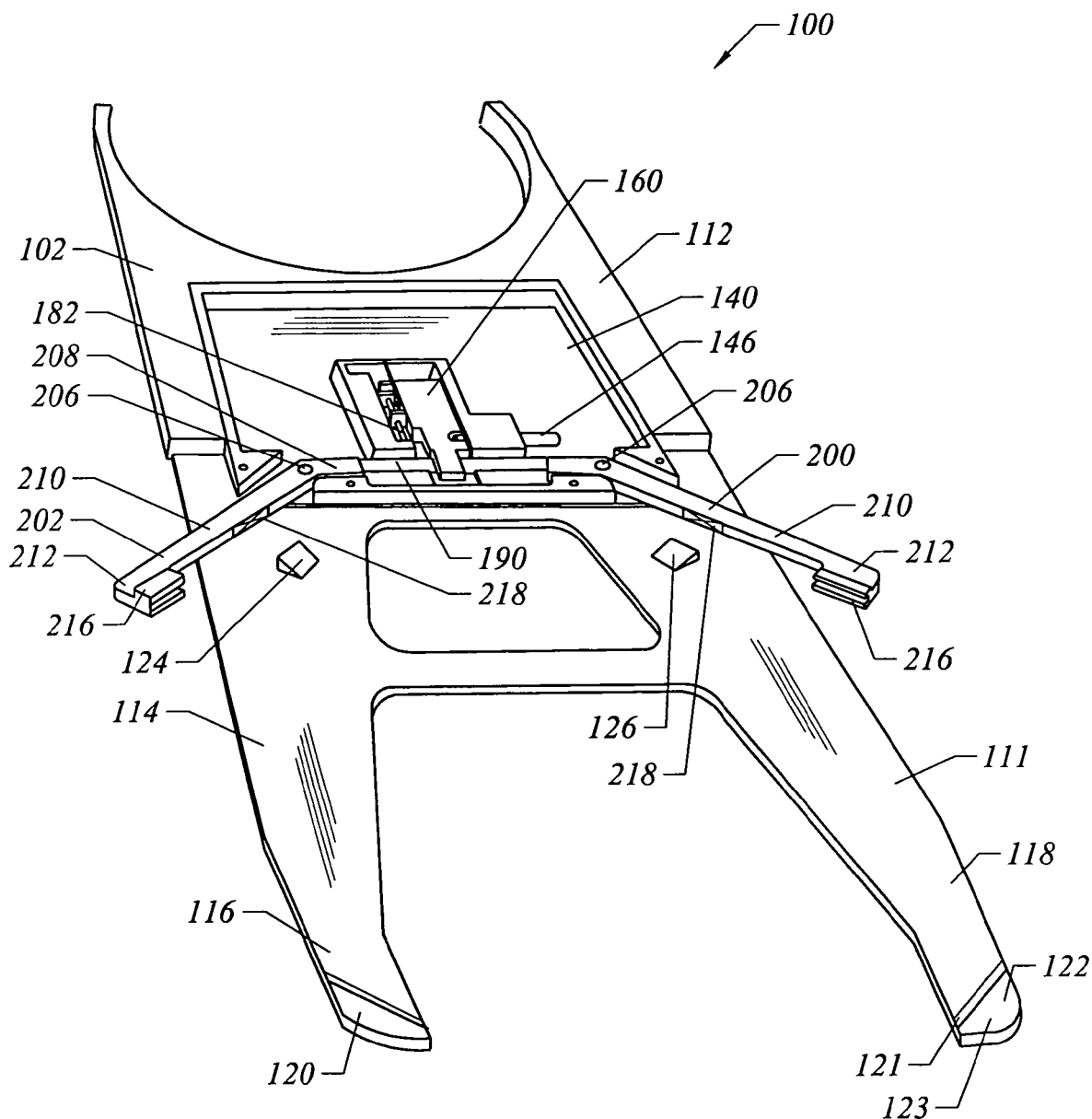
FIG. 11 is a perspective view of another embodiment of an end effector, according to the present invention.

If the wafer 12 is not centered on the wafer blade 111 before the wafer is placed on the end effector 100, the wafer 12 will slide on the supports as the gripper arms 200 push the wafer 12 against the back stop 126. The first and second gripper arms 200 rotate towards the wafer 12 and initially contact the peripheral edge 13 of the wafer 12. The gripper arms 200 minimize the distance the wafer 12 slides on the supports 122 and 124. FIG. 10 illustrates that the contact pads 216 preferably contact the peripheral edge 13 of the wafer 12 such that the center of each pad 216 substantially faces the center C of the wafer 12 (indicated by lines A and B in FIG. 10). This contact pattern, in effect, pushes the wafer 12 forward toward each support 120 along a substantially linear line, indicated as arrow 250.

The gripper arms 200 exert a force against the peripheral edge 13 of the wafer 12 when the gripper arms 200 are in contact with the wafer 12. In a preferred embodiment, a force feedback system monitors, in real time, the force the gripper arms 200 exert on the peripheral edge 13 of the wafer 12. It is within the scope and spirit of the present invention for the force feedback system to periodically monitor the force the gripper arms 200 exert on the peripheral edge 13 of the wafer 12. Monitoring the force exerted on the wafer may also be controlled through an open loop control method. A predetermined grip motion sequence, for example, may be programmed into the processor. In this embodiment, the end effector 100 would not require a force feedback system to measure the force exerted on the wafer 12. Instead, the force exerted on the wafer 12 may be approximated through an algorithm.

The load sensing device 228 is one element of the force feedback system. As previously discussed, the load sensing device 228 measures the force the gripper arms exert on the peripheral edge 13 of the wafer 12. A load sensing device 228 is located behind each contact pad 216. The contact pad 216, when in contact with a wafer 12, is pushed back slightly into the force sensing device 228. The contact between the contact pad 216 and the force sensing device 228 generates an electrical signal that is sent to a processor through the flex circuit 240.

The processor processes the signal and sends an appropriate control signal to the motor assembly 144. For example, if a wafer is not gripped, the force sensing device 228 will read a calibrated "zero" force, and the sensor 214 will not see the wafer edge 13. The motion of each gripper arm 200 is monitored by its physical location and the amount of force it is exerting on the wafer 12. Until the contact pad 216 contacts a wafer 12, there is no force. When the contact pad 216 contacts a wafer, the force sensing device 228 detects a force. The processor, upon receiving a force signal from the force sensing device 228, immediately slows down the motor 146 to achieve a final destination force by the time the gripper arms 200 secure the wafer 12 to the wafer blade 111. This operation may not occur at the same position every time because wafer sizes may vary and the wafer may be initially seated off-center on the wafer blade 111.

The force sensing device 228 provides real-time data to the motor assembly 144 so that the end effector can determine immediately of there is a malfunction. If, for example, the gripper arms 200 attempt to grip the wafer 12 and a wafer 12 is not present on the wafer blade 111, or the wafer 12 slips on the wafer blade 111, the position of motor 146 (as determined by the Hall-effect sensors) will indicate that the gripper arms 200 missed the wafer 12 and moved too far. If, on the other hand, the wafer 12 pops off the support pads 126, the amount of force measured by the force sensing device 228 will drop immediately and indicate to the end effector that a malfunction has occurred. The thru-beam sensors 222 and 224, in addition the force sensing device 228, also detects the edge of a wafer 12. In general, the force sensing device 228 and the optical sensors provide a double check system to detect a wafer 12 on the wafer blade 111.

Figure 12:
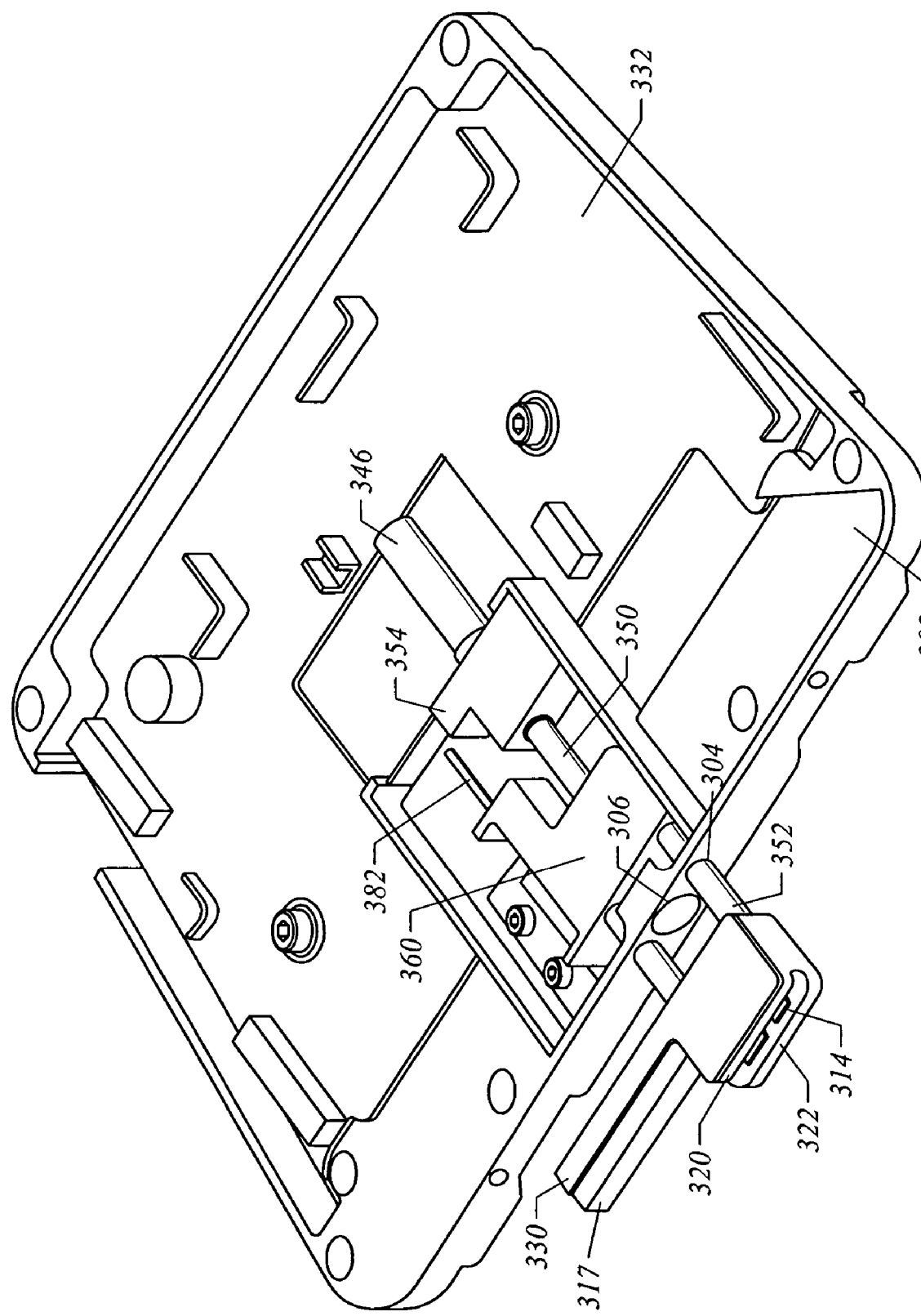
FIG. 12 is a perspective view of yet another embodiment of an end effector, according to the present invention.
Figure 13:
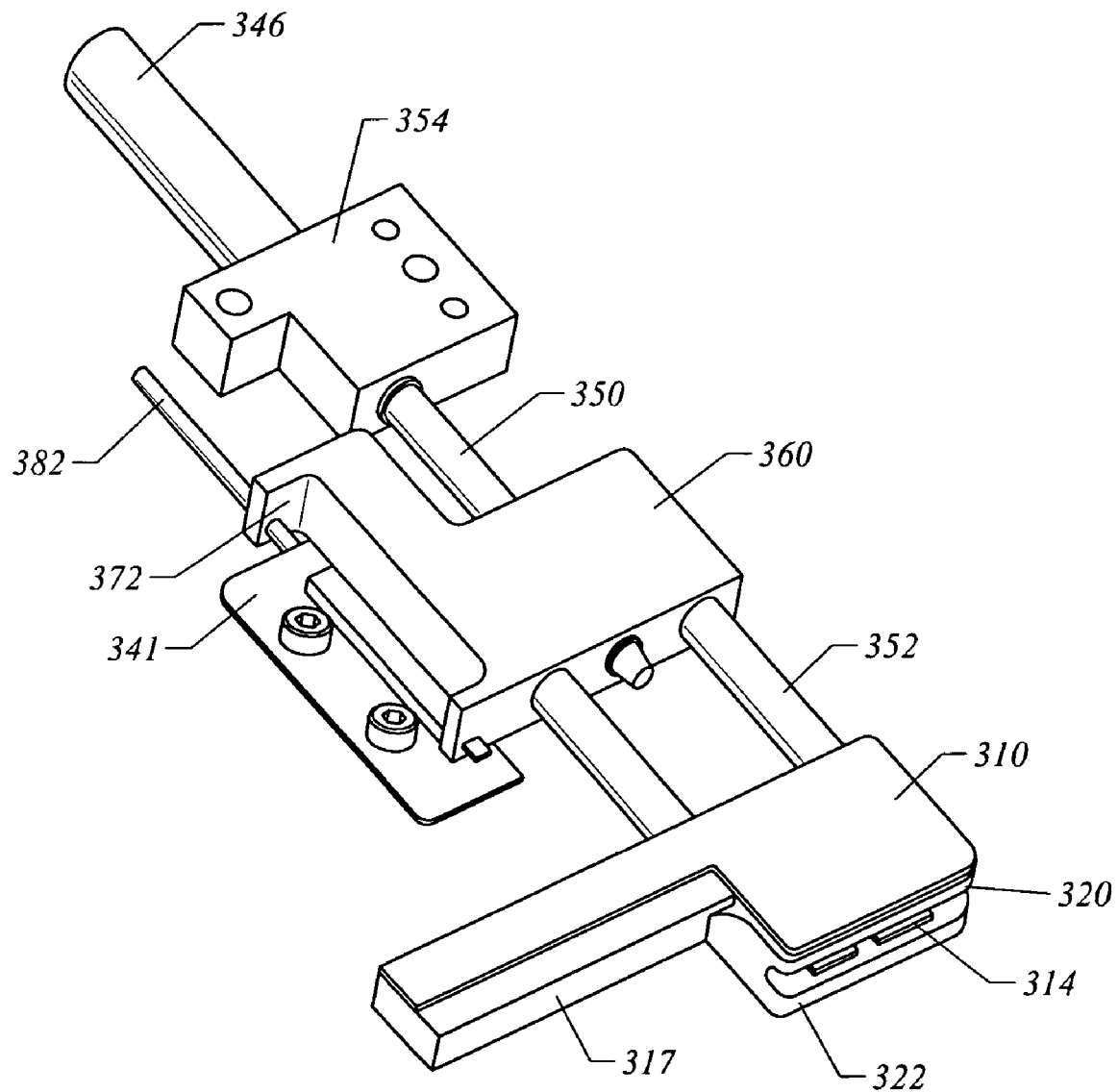
FIG. 13 is a perspective view of the edge gripper plunger motor assembly shown in FIG. 12.

FIGS. 12-13 illustrates yet another embodiment of an end effector. The end effector 300, in general, includes plunger motor assembly 300 that drives a single plunger device 313 to grip a peripheral edge of a wafer. The motor housing assembly 302 preferably employs a 6 mm D.C. brushless motor 346 coupled to a 57:1 planetary gearhead to drive the single plunger. As shown in FIG. 12, the motor 346 is secured to the mounting plate 354. The motor 346 may be secured to the mounting plate 354 by several methods such as, but not limited to, a bolt or screw.

A leadscrew 350 is coupled to the output shaft (not shown) of the planetary gearhead. The leadscrew 350 drives a carriage 360 forwards and backwards along a linear path. The leadscrew 350 imparts the rotary motion of the leadscrew 350 into linear motion of the carriage 360 by an acme thread. The function of a leadscrew is known within the art and does not require further disclosure. In one embodiment, the carriage 260 may travel through a range of motion of approximately 6-7 mm. It is within the scope and spirit of the invention to allow the carriage 360 to have a different range of motion. The plunger motor assembly 300 may also drive the plunger 313 by mechanical means other than a leadscrew as long as the mechanical means may incrementally control the position of the plunger 313.

A locating block 306 maintains the alignment of the leadscrew 350 during the operation of the plunger motor assembly 302. An alignment rod 352 provides a low friction surface to keep the carriage 360 from rotating during its linear motion.

The single plunger device 302 comprises a gripping pad assembly 304 that includes a gripping pad 314. The gripping pad 314 moves forwards and backwards with the carriage 360 and the leadscrew nut 306. The gripping pad 314 may consist of a single or dual pad arrangement. As shown in FIGS. 12-13, the gripping pad 314 includes an upper pad 320 and a lower pad 322. The gripping pad assembly 304 also preferably includes dual through beam sensor arrangement 216 for sensing the edge of a wafer before the gripping pad 314 contacts the wafer. In one embodiment, the gripping pad assembly 304 houses two thru beam sensors 324 and 326 and a load cell (not shown). The gripping pad assembly 304 preferably comprises a semi-flexible material and mounts against an arm 330. The gripping pad assembly 304 therefore flexes towards and contacts the load cell when the contact pads 320 and 322 contact the peripheral edge of the wafer. The load cell accordingly measures the force exerted on the wafer while the wafer is gripped. The gripping pad assembly 304 may also include multiple gripping pads 314.

The end effector 300 includes several components that are similar to the previously disclosed embodiments—such as the end effector 100. The end effector 300 includes, for example, a hard-stop 341, a printed circuit board 332, and a guide rail 382. The motion of the carriage 360 is restricted by the guide rail 382 and the hard-stop 341—similar to how the motion of the carriage 160 is restricted by the hard-stop 141 and the guide rail 182 concerning the end effector 100. The printed circuit board 332 also includes a processor for coordinating a force feedback system similar to the force feedback system previously discussed above concerning the end effector 100. The processor and PCB 132 may be located remotely and do not have to me mounted on the end effector 100.

The foregoing description of preferred embodiments of the present invention has been provided for the purposes of illustration and description. It is not intended to be exhaustive or to limit the invention to precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiment and with various modifications as are suited to the particular use contemplated. It is intended that the scope of the invention be defined by the following claims and their equivalents.

The invention claimed is:

1. An end effector adapted to grip a peripheral edge of a workpiece, comprising:
    a workpiece blade for supporting a workpiece;
    a first gripper arm operatively mounted to said workpiece blade, said first gripper arm including a first contact pad and first load sensing device for generating electrical signals representing the amount of force said first contact pad is exerting on the workpiece;
    a second gripper arm operatively mounted to said workpiece blade, said second gripper arm having a second contact pad and a second load sensing device for generating electrical signals representing the amount of force said second contact pad is exerting on the workpiece, wherein said first gripper arm and said second gripper arm each include a proximal end and a distal end, said proximal end of said first gripper arm and said second gripper arm are each rotatably connected to a proximal end of said workpiece blade;
    a motor assembly for moving said first and second gripper arms between a workpiece-loading position and a workpiece-engaging position; and
    a processor for receiving said electrical signals from said first load sensing device and said second load sensing device and controlling the drive current supplied to said motor assembly, enabling said processor to continually adjust the force said first contact pad and said second contact pad exerts on the workpiece.

2. The end effector according to claim 1, wherein said first and second contact pads further include sensors adapted to detect the edge of the workpiece.

3. The end effector according to claim 2, wherein said sensors comprise thru-beam sensors.

4. The end effector according to claim 1, wherein said first and second load sensing devices comprises a load cell.

5. The end effector according to claim 1, wherein said first and second load sensing devices comprises a strain gauge.

6. The end effector according to claim 1, wherein said workpiece blade includes a distal end.

7. The end effector according to claim 6, wherein said distal end of said workpiece blade comprises a first finger and a second finger.

8. The end effector according to claim 7, wherein said first finger and said second finger each include a workpiece support pad.

9. The end effector of claim 1, wherein the processor controls the drive current supplied to said motor assembly in real time and wherein said motor assembly includes,
    a cam coupled to an output shaft, said cam having a geometrical center that is offset from a rotational center of said output shaft; and
    a carriage having a drive slot adapted to receive said cam.

10. An end effector adapted to grip a peripheral edge of a workpiece, comprising:
    a workpiece blade for supporting a workpiece;
    a first gripper arm and a second gripper arm each operatively mounted to said workpiece blade, said first and second gripper arms each including a contact pad;
    a motor assembly for moving said first and second gripper arms between a workpiece-loading position and a workpiece-engaging position, said contact pads contacting the peripheral edge of the workpiece and exerting a force on the workpiece when said first and second gripper arms are located in said workpiece-engaging position, said motor assembly including:
        a motor having an output shaft;
        a cam coupled to said output shaft, said cam having a geometrical center that is offset from a rotational center of said output shaft;
        a carriage having a drive slot adapted to receive said cam; and
    a real-time force feedback system for generating an electrical signal representing the amount of force said contact pads exert on the peripheral edge of the wafer and controlling said electrical signal supplied to said motor assembly for dynamically adjusting the force exerted by said contact pads on the workpiece while said first and second gripper arms are located in said workpiece-engaging position.

11. The end effector according to claim 10, wherein said real-time force feedback system comprises:
    a force sensing device coupled to each one of said contact pads, each force sensing device adapted to generate an electrical signal representing the amount of force said contact pad exerts against the workpiece; and
    a processor for receiving said electrical signal from each said force sensing device and controlling the drive current supplied to said motor so that said motor may adjust the position of said first and second gripper arms.

12. An apparatus for handling wafers, comprising:
    a wafer blade for supporting a wafer;
    a first contact arm and a second contact arm each operatively mounted to said wafer blade, said first and second contact arms each having a contact pad adapted to contact a peripheral edge of the wafer, wherein said first contact arm and said second contact arm each include a proximal end and a distal end, said proximal end of said first contact arm and said second contact arm are each rotatably connected to a proximal end of said wafer blade;
    a motor assembly operatively connected to said first and second contact arms, said motor assembly for moving said first and second contact arms between a wafer-loading position that allows a wafer to be loaded onto said wafer blade and a wafer-engaging position where each said contact pad contacts the peripheral edge of the wafer;
    a force sensing device coupled to each one of said contact pads, each force sensing device adapted to generate electrical signals representing the amount of force said contact pad is exerting against the peripheral edge of the workpiece; and a processor for receiving said electrical signals from each said force sensing device and controlling the drive current supplied to said motor assembly such that said processor maintains said electrical signals received from said force sensing devices at a substantially constant level.

13. The apparatus according to claim 12, wherein each said force sensing device measures the force said contact pad exerts on the wafer in real-time.

14. The apparatus according to claim 12, wherein each said contact pad further includes a sensor adapted to detect the edge of the wafer.

15. The apparatus according to claim 12, wherein each said force sensing device comprises a load cell.

16. The apparatus according to claim 12, wherein said force sensing device comprises a strain gauge.

17. The apparatus of claim 12, wherein the processor controls the drive current supplied to said motor assembly in real time and wherein said motor assembly includes, a cam coupled to an output shaft, said cam having a geometrical center that is offset from a rotational center of said output shaft; and a carriage having a drive slot adapted to receive said cam.

* * * * *

UNITED STATES PATENT AND TRADEMARK OFFICE
CERTIFICATE OF CORRECTION

PATENT NO. : 7,300,082 B2 Page 1 of 1
APPLICATION NO. : 10/624133
DATED : November 27, 2007
INVENTOR(S) : Theodore W. Rogers, Shawn M. Hamilton and Michael J. Mayo It is certified that error appears in the above-identified patent and that said Letters Patent is hereby corrected as shown below:

The Title page, item [73] should read --ACTIVE EDGE GRIPPING END EFFECTOR--

Signed and Sealed this

Seventeenth Day of June, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,300,082 B2 | Page 1 of 1 |
| APPLICATION NO. | : 10/624133 | |
| DATED | : November 27, 2007 | |
| INVENTOR(S) | : Theodore W. Rogers, Shawn M. Hamilton and Michael J. Mayo | |

It is certified that error appears in the above-identified patent and that said Letters Patent is hereby corrected as shown below:

The Title page, item [54] should read --ACTIVE EDGE GRIPPING END EFFECTOR--

This certificate supersedes the Certificate of Correction issued June 17, 2008.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,300,082 B2 | Page 1 of 1 |
| APPLICATION NO. | : 10/624133 | |
| DATED | : November 27, 2007 | |
| INVENTOR(S) | : Theodore W. Rogers, Shawn M. Hamilton and Michael J. Mayo | |

It is certified that error appears in the above-identified patent and that said Letters Patent is hereby corrected as shown below:

The Title page, item [54] and Column 1, line 1, should read --ACTIVE EDGE GRIPPING END EFFECTOR--

This certificate supersedes the Certificates of Correction issued June 17, 2008 and July 22, 2008.

Signed and Sealed this

Twelfth Day of August, 2008

JON W. DUDAS
*Director of the United States Patent and Trademark Office*